United States Patent
Chi et al.

(10) Patent No.: US 9,012,933 B2
(45) Date of Patent: Apr. 21, 2015

(54) LIGHT-EMITTING DIODE HAVING A ROUGHENED SURFACE

(71) Applicant: Epistar Corporation, Hsinchu (TW)

(72) Inventors: Liang-Sheng Chi, Hsinchu (TW); Pei-Chia Chen, Hsinchu (TW); Chih-Hao Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 5 days.

(21) Appl. No.: 13/858,504

(22) Filed: Apr. 8, 2013

(65) Prior Publication Data

US 2014/0299901 A1    Oct. 9, 2014

(51) Int. Cl.
| H01L 33/00 | (2010.01) |
| H01L 29/06 | (2006.01) |
| H01L 31/00 | (2006.01) |
| H01L 33/22 | (2010.01) |
| H01L 27/15 | (2006.01) |

(52) U.S. Cl.
CPC ............... *H01L 33/22* (2013.01); *H01L 27/153* (2013.01); *H01L 33/0095* (2013.01)

(58) Field of Classification Search
USPC .......................... 257/21, 94, E31.13, E33.074
See application file for complete search history.

(56) References Cited

U.S. PATENT DOCUMENTS

| 5,814,839 | A * | 9/1998 | Hosoba | 257/96 |
| 7,504,667 | B2 * | 3/2009 | Fujikura et al. | 257/98 |
| 7,541,206 | B2 * | 6/2009 | Yoon et al. | 438/29 |
| 2009/0159910 | A1 * | 6/2009 | Lin et al. | 257/98 |
| 2012/0322185 | A1 * | 12/2012 | Yao et al. | 438/29 |

\* cited by examiner

*Primary Examiner* — Ida M Soward
(74) *Attorney, Agent, or Firm* — Ditthavong & Steiner, P.C.

(57) ABSTRACT

A light-emitting diode includes a substrate, the substrate including an upper surface, a bottom surface opposite to the upper surface, and a side surface; a first type semiconductor layer on the upper surface, wherein the first type semiconductor layer includes a first portion and a second portion, and the second portion includes an edge surrounding the first portion; a light-emitting layer on the first portion; and a second type semiconductor layer on the light-emitting layer, wherein the second portion includes a first surface and a second surface, and a first distance is between the first surface and the upper surface, and a second distance is between the second surface and the upper surface and is smaller than the first distance; wherein the first surface is rougher than the second surface, and the second surface is located at the edge.

13 Claims, 11 Drawing Sheets

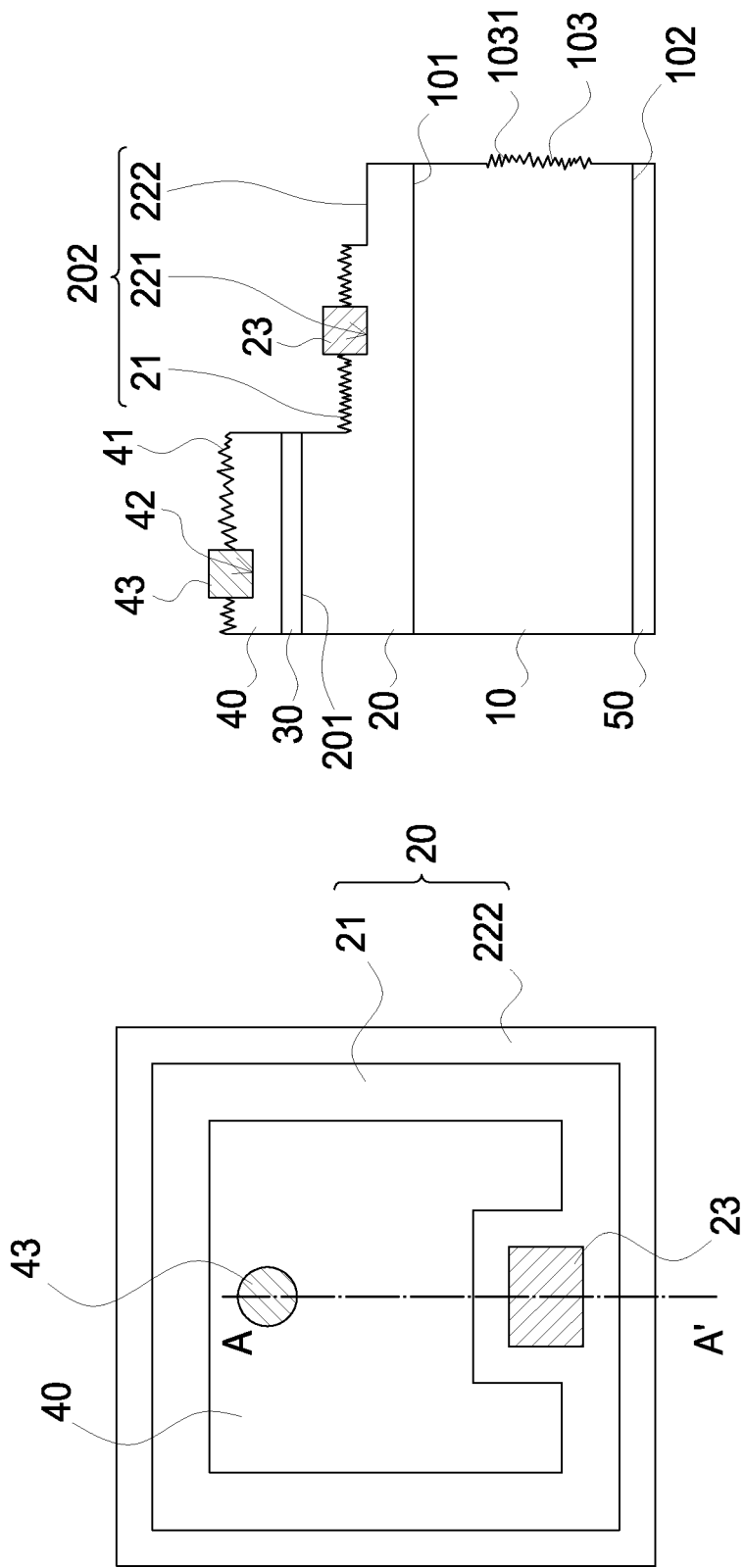

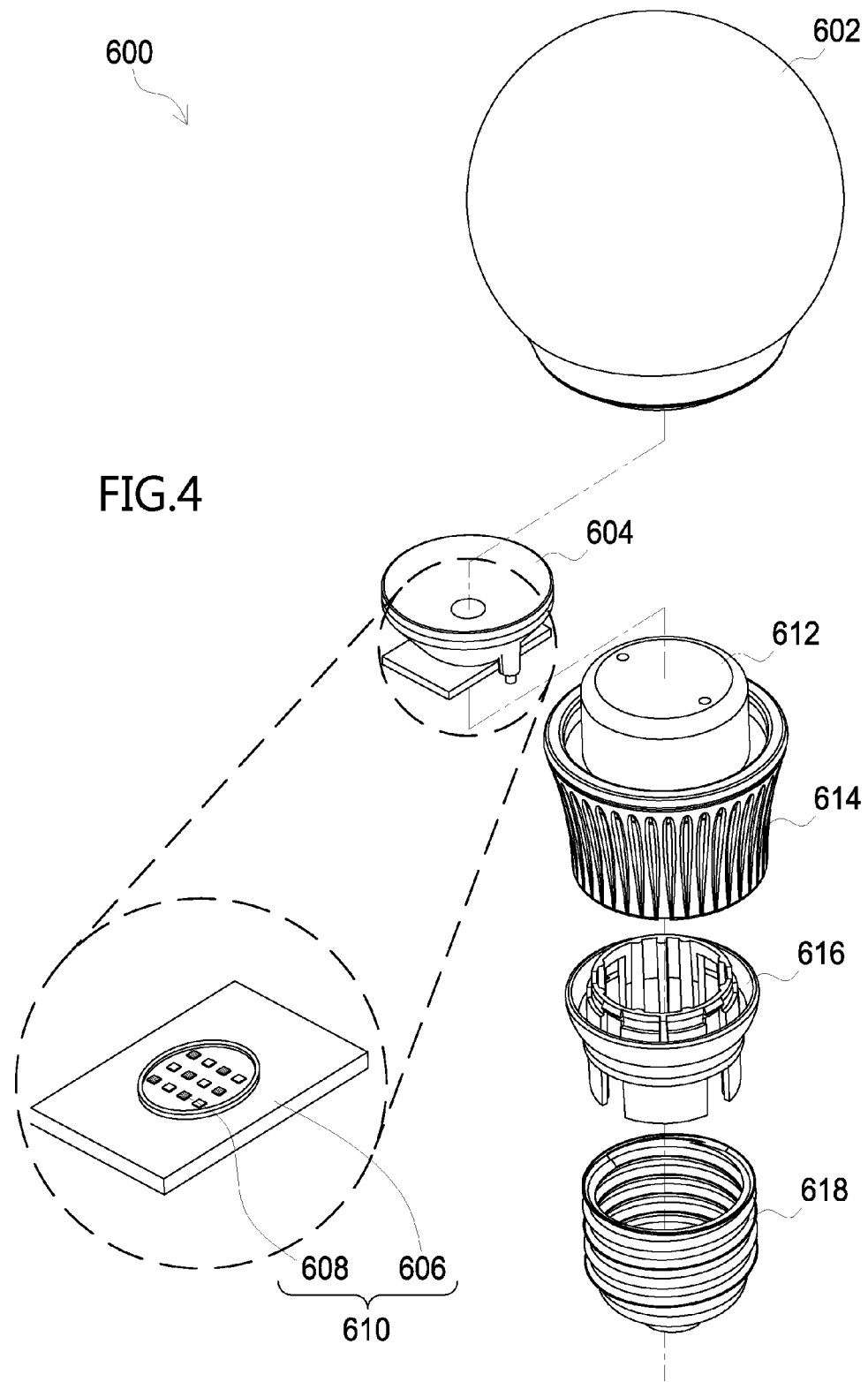

US 9,012,933 B2

LIGHT-EMITTING DIODE HAVING A ROUGHENED SURFACE

TECHNICAL FIELD

The present application relates to a method of dicing a wafer to improve the production of light-emitting diodes and decreasing the cost thereof.

DESCRIPTION OF BACKGROUND ART

As the light emitting efficiency of the light-emitting diode (LED) is increased in recent years, the application of the light-emitting diode has expanded from decoration lighting to the general lighting. The light-emitting diode also has gradually replaced the traditional fluorescent lamp to be the light source of the next generation.

The final step of producing the light-emitting diodes is dicing the wafer. In the step of dicing, firstly the wafer is cut by laser, and then the wafer is cleaved into a plurality of light-emitting diodes. Traditionally, the laser ablates or melts the wafer from the wafer's surface to the wafer's interior. The wafer has semiconductor stacking layers on the surface. Thus, when the wafer is ablated or melted by the laser, the light-absorbing substance which is able to absorb the light is generated.

The above light-emitting diode can further comprise a sub-mount to form a light-emitting device, wherein the light-emitting device comprises electric circuitries disposed on the sub-mount, at least a solder on the sub-mount to fix the light-emitting diode on the sub-mount, and an electrical connection structure to electrically connect an electrical pad of the light-emitting diode (LED) and the electric circuitries of the sub-mount. The sub-mount can be a lead frame or a mounting substrate for electrical circuit design and heat dissipation improvement.

SUMMARY OF THE DISCLOSURE

A light-emitting diode, comprising: a substrate, the substrate comprising an upper surface, a bottom surface opposite to the upper surface, and a side surface; a first type semiconductor layer on the upper surface, wherein the first type semiconductor layer comprises a first portion and a second portion, and the second portion comprises an edge surrounding the first portion; a light-emitting layer on the first portion; and a second type semiconductor layer on the light-emitting layer, wherein the second portion comprises a first surface and a second surface, and a first distance is between the first surface and the upper surface, and a second distance is between the second surface and the upper surface and is smaller than the first distance; wherein the first surface is rougher than the second surface, and the second surface is located at the edge.

A method of manufacturing a light-emitting diode, comprising the steps of: provide a substrate; providing a semiconductor stack layer on the substrate, wherein the semiconductor stack layer comprises a first surface opposite to the substrate; treating the first surface to form a second surface, wherein the second surface is flatter than the first surface; and providing a laser beam through the second surface to separate the substrate.

BRIEF DESCRIPTION OF THE DRAWINGS

FIGS. 1A and 1B schematically show a light-emitting diode in accordance with an embodiment of the present application;

FIG. 4 shows a light bulb having the LED array from any one of the first to third embodiments.

DETAILED DESCRIPTION OF PREFERRED EMBODIMENTS

Figure 2A:
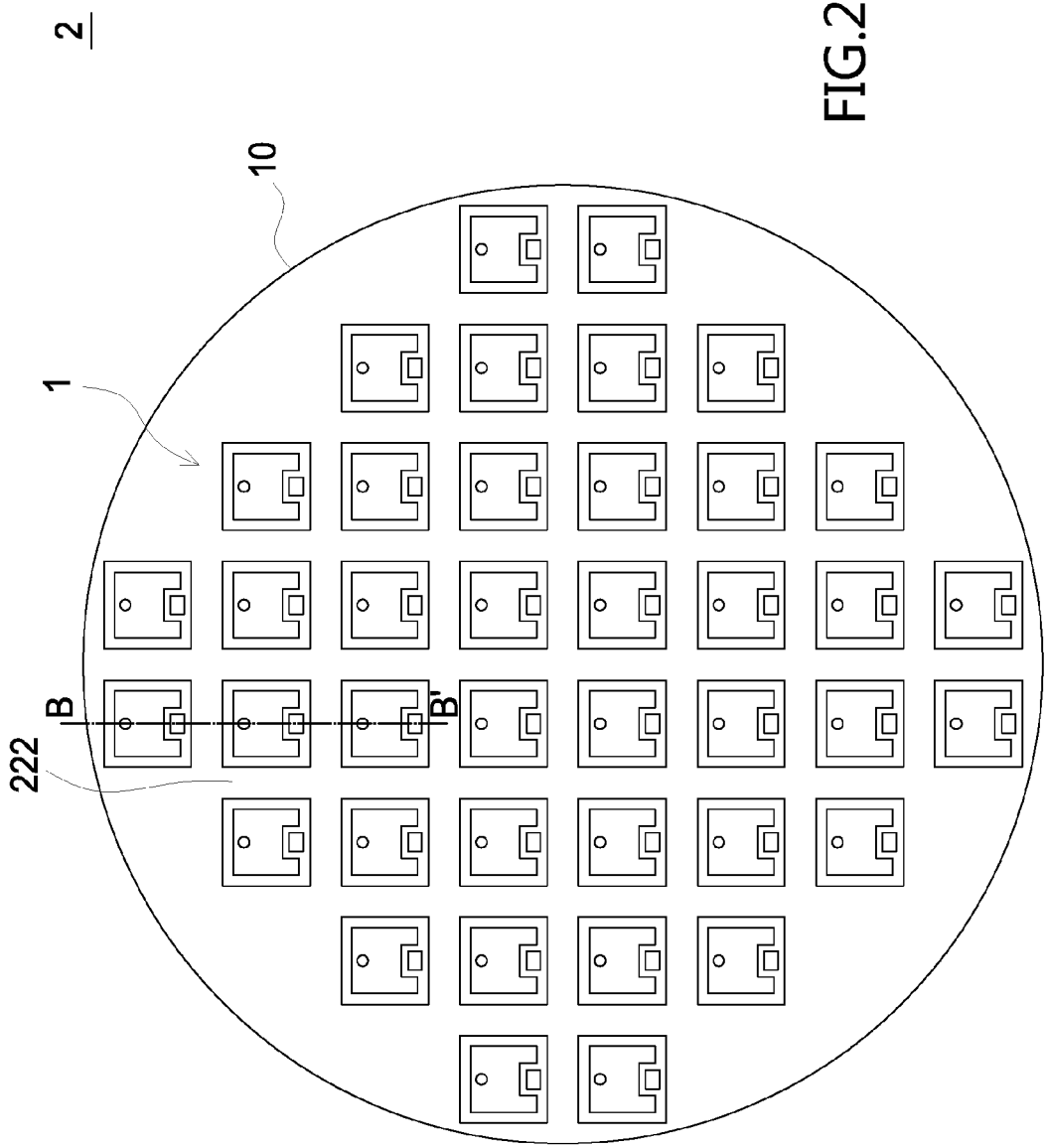
FIGS. 2A and 2B schematically show a wafer device in accordance with an embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

FIGS. 1A and 1B schematically show a light-emitting diode in accordance with an embodiment of the present application. FIG. 1A shows a top view of a light-emitting diode comprising a first type semiconductor layer 20, a second type semiconductor layer 40 on the first type semiconductor layer 20, a first electrical pad 23 ohmically contacts the first type semiconductor layer 20 and a second electrical pad 43 ohmically contacts the second type semiconductor layer 40. The first type semiconductor layer 20 comprises a first surface 21 and a second surface 222, wherein the second surface 222 surrounds the first portion.

FIG. 1B shows the cross-sectional view of the dotted line AA' in FIG. 1A. The light-emitting diode comprises a transparent substrate 10 having an upper surface 101, a bottom surface 102, and a side surface 103 between the upper surface 101 and the bottom surface 102, a first type semiconductor layer 20 on the upper surface 101, a light-emitting layer 30 on the first type semiconductor layer 20, a second type semiconductor layer 40 on the light-emitting layer 30, a first electrical pad 23 ohmically contacts the first type semiconductor layer 20, a second electrical pad 43 ohmically contacts the second type semiconductor layer 40, and a reflective layer 50 on the bottom surface 102, wherein the side surface 103 comprises a damage region 1031.

The material of the transparent substrate 10 comprises the transparent material, such as sapphire ($Al_2O_3$), GaN, SiC, AlN, ZnO or MgO, $SiO_2$, $B_2O_3$ or BaO, so the transparent substrate 10 can be penetrated by a laser beam which is able to focus on the interior thereof. The damage region 1031 is formed on the side surface 103 during the laser penetration and is distant from the upper surface 101 and the bottom surface 102. The wavelength region of the laser beam comprises 350-500, 350-800, 350-1200, 500-1000, 700-1200 or 350-1500 nm. The first type semiconductor layer 20 comprises a first portion 201 and a second portion 202, the light-emitting layer 30 is on the first portion 201, and the second type semiconductor layer 40 is on the light-emitting layer 30. When the first type semiconductor layer 20 is p-type semiconductor material, the second type semiconductor layer 40 can be n-second type semiconductor. Conversely, when the first type semiconductor layer 20 is n-type semiconductor material, the second type semiconductor layer 40 can be semiconductor material. The light-emitting layer 30 can be intrinsic semiconductor material, p-type semiconductor material or n-type semiconductor material. When an electrical current flows through the first type semiconductor layer 20, the light-emitting layer 30, and the second type semiconductor layer 40, the light-emitting layer 30 can emit a light. When the light-emitting layer 30 is $Al_aGa_bIn_{1-a-b}P$, the light-emitting layer 30 can emit a red, orange, or yellow light. When the light-emitting layer 30 is $Al_cGa_dIn_{1-c-d}N$, the light-emitting layer 30 can emit a blue or green light.

The second portion 202 of the first type semiconductor layer 20 comprises a first surface 21, a second surface 222 and a third surface 221. The second type semiconductor layer 40 comprises a fifth surface 41 and a fourth surface 42. The average roughness (Ra) of the first surface 21 and that of the fifth surface 41 are larger than 100 nm. The average roughness (Ra) of each of the second surface 222, third surface 221 and the fourth surface 42 is in a range of 10 nm to 100 nm, and preferably is smaller than 50 nm. The second surface 222 and the third surface 221 are flatter than the first surface 21, and the fourth surface 42 is flatter than the fifth surface 41. The average roughness (Ra) of the first surface 21 and that of the fifth surface 41 larger than 100 nm can reduce the total internal reflection of the light emitted from the light-emitting layer 30 to increase the light extraction efficiency. The second surface 222, the third surface 221 and the fourth surface 42 are formed by regionally treating the first surface 21 and the fifth surface 41 at the same time with the same process, such as wet etching or dry etching, so the difference of the average roughness (Ra) between the fourth surface 42, or the third surface 221, and the second surface 222 is smaller than 50 nm. Thus, the depth of the second surface 222 or the third surface 221 related to the first surface 21 is the same as that of the fourth surface 42 related to the fifth surface 41. The depth of the second surface 222 or the third surface 221 related to the first surface 21 is in a range of 2000 Å and 10000 Å, and preferably in a range of 4000 Å and 7000 Å. The depth of the fourth surface 42 related to the fifth surface 41 is in a range of 2000 Å and 10000 Å, and preferably in a range of 4000 Å and 7000 Å.

The first electrical pad 23 is formed on the third surface 221 and ohmically contacts the first type semiconductor layer 20. The second electrical pad 43 is formed on the fourth surface 42 and ohmically contacts the second type semiconductor layer 40. The first electrical pad 23 and the second electrical pad 43 are operable for conducting an electrical current from outside to flow through the first type semiconductor layer 20, the light-emitting layer 30, and the second type semiconductor layer 40. The material of the first electrical pad 23 and the second electrical pad 43 comprises the metal material, such as Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo or La, or metal alloy, such as Ag—Ti, Cu—Sn, Cu—Zn, Cu—Cd, Sn—Pb—Sb, Sn—Pb—Zn, Ni—Sn, Ni—Co, Au alloy, or Ge—Au—Ni.

The second surface 222 surrounds the first portion and is therefore located at the edge of the light-emitting diode. The width of the second surface 222 is in a range of 5 µm and 15 µm, and preferably is 10 µm. Because the average roughness (Ra) of the second surface 222 is in a range of 10 nm to 100 nm, and preferably is smaller than 50 nm, the laser beam can penetrate the second surface 222 to focus in the interior of the substrate 10.

The reflective layer 50 on the bottom surface 102 can reflect the light emitted from the light-emitting layer 30 to increase the light extraction efficiency. The reflective layer 50 comprises a metal layer, DBR, or the combination thereof. The reflectivity of the reflective layer 50 is larger than 70% for the laser beam, of which the wavelength region is in a range of 350 nm and 500 nm, 350 nm and 800 nm, 350 nm and 1200 nm, 500 nm and 1000 nm, 700 nm and 1200 nm, or 350 nm and 1500 nm.

Second Embodiment

Figure 2B:
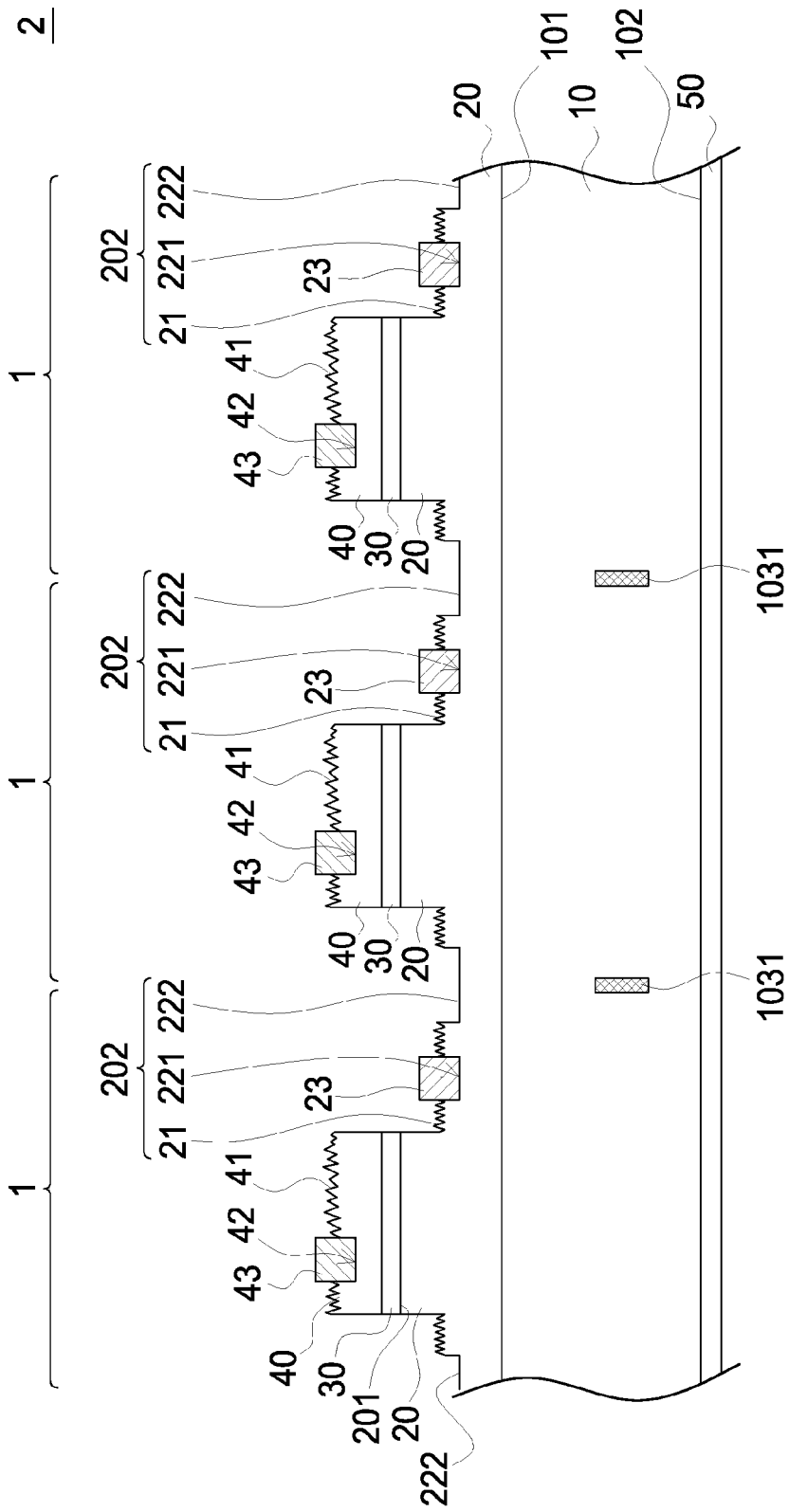

FIGS. 2A and 2B schematically show a wafer device 2 in accordance with an embodiment of the present application. FIG. 2A shows that a wafer device 2 has a transparent substrate 10 and a plurality of units 1 on the substrate 10. Any two of the units 1 are spaced by a second surface 222. A plurality of light-emitting diodes can be produced by cleaving the wafer device 2 along the second surface 222.

FIG. 2B shows the cross-sectional view of the dotted line BB' in FIG. 2A. The transparent substrate 10 has an upper surface 101 and a bottom surface 102. The material of the transparent substrate 10 comprises the transparent material, such as sapphire ($Al_2O_3$), GaN, SiC, AlN, ZnO or MgO, $SiO_2$, $B_2O_3$ or BaO, so the transparent substrate 10 can be penetrated by a laser beam which is able to focus on interior thereof. The damage region 1031 is formed in the interior of the substrate 10 and is distant from both of the upper surface 101 and the bottom surface 102. The wavelength range of the laser beam comprises 350-500, 350-800, 350-1200, 500-1000, 700-1200 or 350-1500 nm.

A first type semiconductor layer 20 is formed on the upper surface 101, which has a plurality of first portions 201 and a plurality of second portions 202. On each of the plurality of first portions 201, a light-emitting layer 30 is formed thereon, and a second type semiconductor layer 40 is formed on the light-emitting layer 30. When the first type semiconductor layer 20 is p-type semiconductor material, the second type semiconductor layer 40 can be n-second type semiconductor. Conversely, when the first type semiconductor layer 20 is n-type semiconductor material, the second type semiconductor layer 40 can be p-type semiconductor material. The light-emitting layer 30 can be intrinsic semiconductor material, p-type semiconductor material or n-type semiconductor material. When an electrical current flows through the first type semiconductor layer 20, the light-emitting layer 30 and the second type semiconductor layer 40, the light-emitting layer 30 can emit a light. When the light-emitting layer 30 is $Al_aGa_bIn_{1-a-b}P$, the light-emitting layer 30 can emit a red, orange or yellow light. When the light-emitting layer 30 is $Al_cGa_dIn_{1-c-d}N$, the light-emitting layer 30 can emit a blue or green light.

Each of the plurality of second portions 202 of the first type semiconductor layer 20 comprises a first surface 21, a second surface 222 and a third surface 221. The second type semiconductor layer 40 comprises a fifth surface 41 and a fourth surface 42. The average roughness (Ra) of the first surface 21 and the fifth surface 41 is larger than 100 nm. The average roughness (Ra) of each of the second surface 222, the third surface 221 and that of the fourth surface 42 is in a range of 10 nm to 100 nm, and preferably is smaller than 50 nm. The second surface 222 and the third surface 221 are flatter than the first surface 21, and the fourth surface 42 is flatter than the fifth surface 41. The average roughness (Ra) of the first surface 21 and that of the fifth surface 41 which are larger than 100 nm can reduce the total internal reflection of the light emitted from the light-emitting layer 30 to increase the light extraction efficiency. The second surface 222, the third surface 221 and the fourth surface 42 are formed by regionally treating the first surface 21 and the fifth surface 41 at the same time with the same process, such as wet etching or dry etching, so the difference of the average roughness (Ra) between the fourth surface 42, or the third surface 221, and the second surface 222 is smaller than 50 nm. Thus, the depth of the second surface 222 or the third surface 221 related to the first surface 21 is the same as that of the fourth surface 42 related to the fifth surface 41. The depth of the second surface 222 or the third surface 221 related to the first surface 21 is in a range of 2000 Å and 10000 Å, and preferably in a range of 4000 Å and 7000 Å. And, the depth of the fourth surface 42 related to the fifth surface 41 is also in a range of 2000 Å and 10000 Å, and preferably in a range of 4000 Å and 7000 Å.

The first electrical pad 23 is formed on the third surface 221 and ohmically contacts the first type semiconductor layer 20. The second electrical pad 43 is formed on the fourth surface 42 and ohmically contacts the second type semiconductor layer 40. The first electrical pad 23 and the second electrical pad 43 are operable for conducting an electrical current from outside to flow through the first type semiconductor layer 20, the light-emitting layer 30, and the second type semiconductor layer 40. The material of the first electrical pad 23 and the second electrical pad 43 comprises the metal material, such as Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo or La, or metal alloy, such as Ag—Ti, Cu—Sn, Cu—Zn, Cu—Cd, Sn—Pb—Sb, Sn—Pb—Zn, Ni—Sn, Ni—Co, Au alloy, or Ge—Au—Ni. Because the average roughness (Ra) of the second surface 222 is in a range of 10 nm to 100 nm, and preferably is smaller than 50 nm, the laser beam can penetrate the second surface 222 to focus in the interior of the transparent substrate 10 under the upper surface 101. For the first surface 21, because the average roughness (Ra) thereof is larger than 100 nm, the laser beam is scattered by the first surface 21 and fails to focus in the interior of the transparent substrate 10 under the upper surface 101. Therefore, a laser beam can penetrate the second surface 222 and focus in the interior of the transparent substrate 10 to form the plurality of damage regions 1031.

A reflective layer 50 is formed on the bottom surface 102 of the transparent substrate 10. The reflective layer 50 can reflect the light emitted from the light-emitting layer 30 to increase the light extraction efficiency. The reflective layer 50 comprises a metal layer, DBR, or the combination thereof. The reflectivity of the reflective layer 50 is larger than 70% for a laser beam, of which the wavelength region is in a range of 350 nm and 500 nm, 350 nm and 800 nm, 350 nm and 1200 nm, 500 nm and 1000 nm, 700 nm and 1200 nm or 350 nm and 1500 nm.

Third Embodiment

Figure 3A:
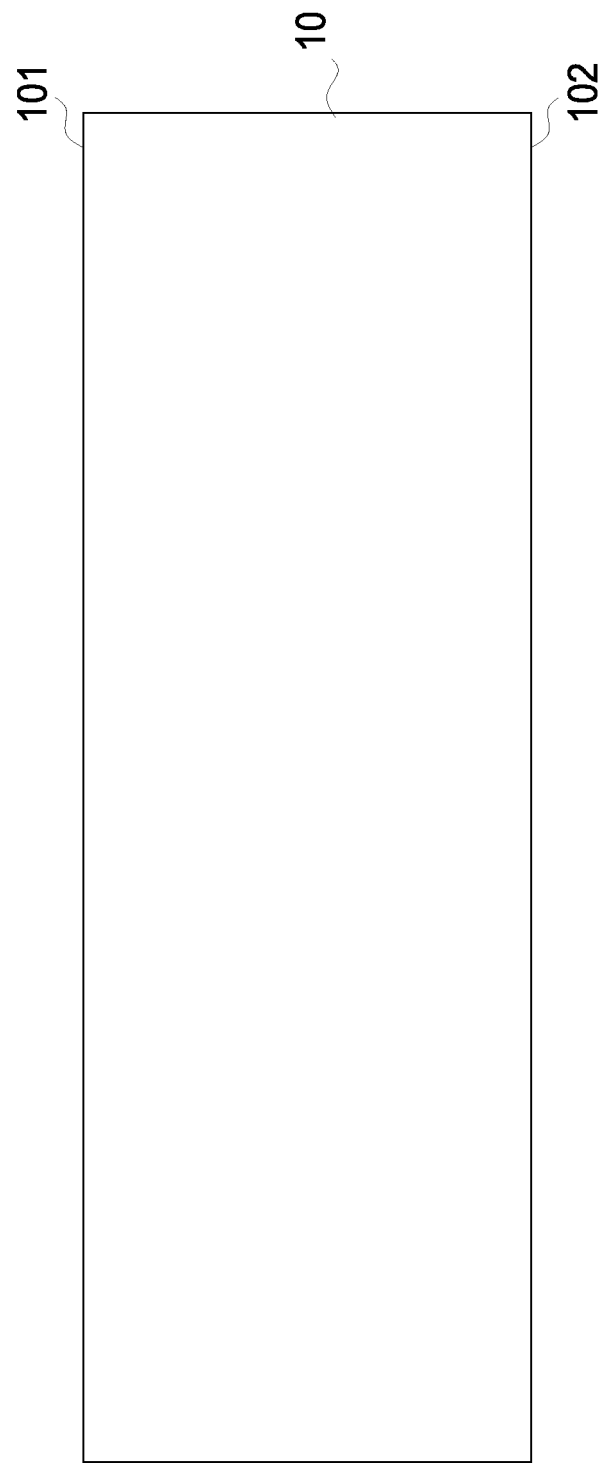
FIGS. 3A to 3G schematically show a method of manufacturing the light-emitting diode in accordance with an embodiment of the present application.

FIGS. 3A to 3G schematically show a method of manufacturing the light-emitting diode in accordance with an embodiment of the present application. FIG. 3A shows the first step of providing a substrate 10. The transparent substrate 10 has an upper surface 101 and a bottom surface 102. The material of the transparent substrate 10 comprises the transparent material, such as sapphire ($Al_2O_3$), GaN, SiC, AlN, ZnO or MgO, $SiO_2$, $B_2O_3$ or BaO, so the transparent substrate 10 can be penetrated by a laser beam to focus interior thereof.

Figure 3B:
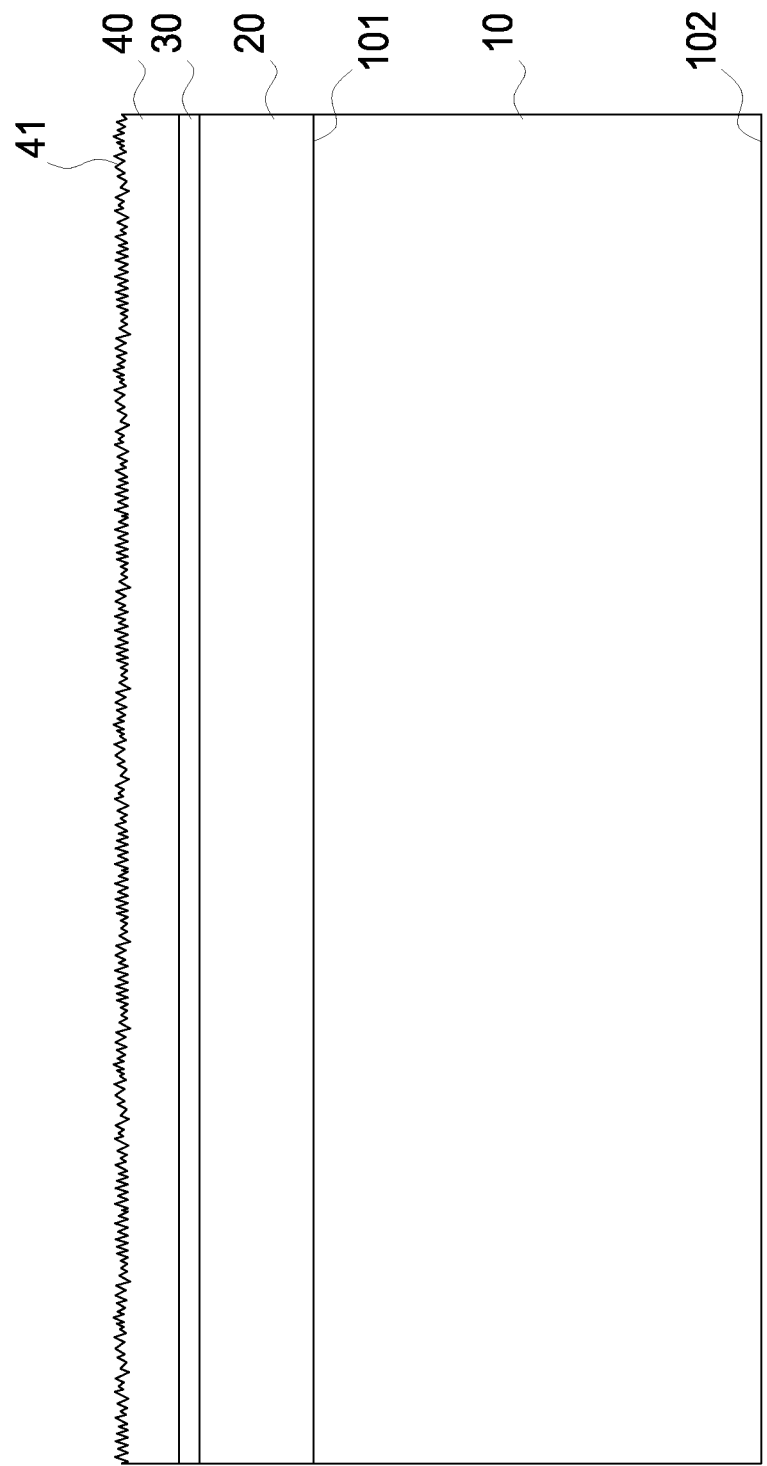

FIG. 3B shows the step of forming a first type semiconductor layer 20, a light-emitting layer 30, and a second type semiconductor layer 40 sequentially. The second type semiconductor layer 40 comprises a fifth surface 41, and the average roughness (Ra) of the fifth surface 41 is larger than 100 nm. When the first type semiconductor layer 20 is p-type semiconductor material, the second type semiconductor layer 40 can be n-second type semiconductor. Conversely, when the first type semiconductor layer 20 is n-type semiconductor material, the second type semiconductor layer 40 can be p-type semiconductor material. The light-emitting layer 30 can be intrinsic semiconductor material, p-type semiconductor material or n-type semiconductor material. When an electrical current flows through the first type semiconductor layer 20, the light-emitting layer 30, and the second type semiconductor layer 40, the light-emitting layer 30 can emit a light. When the light-emitting layer 30 is $Al_aGa_bIn_{1-a-b}P$, the light-emitting layer 30 can emit a red, orange or yellow light. When the light-emitting layer 30 is $Al_cGa_dIn_{1-c-d}N$, the light-emitting layer 30 can emit a blue or green light.

Figure 3C:
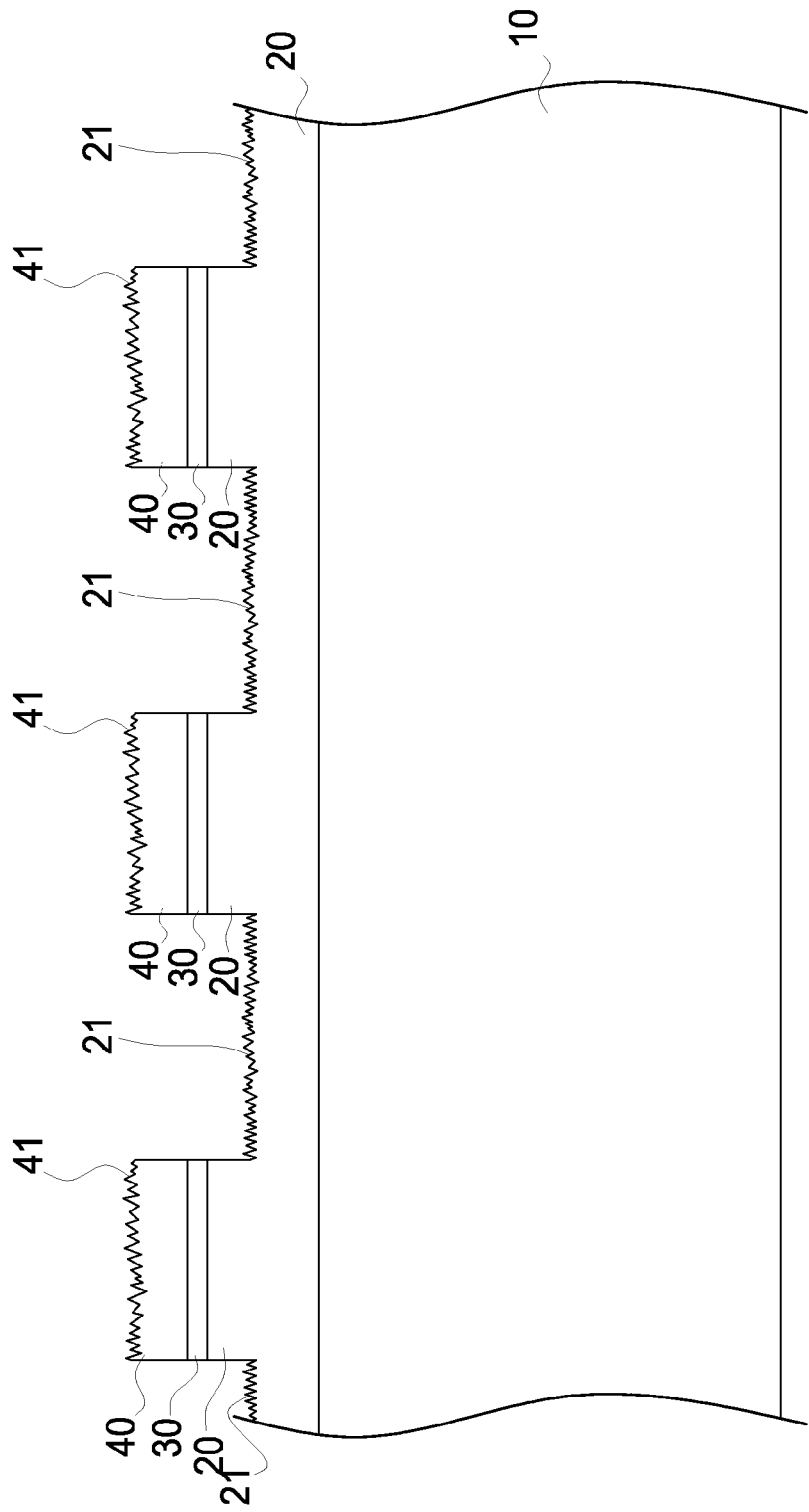

FIG. 3C shows the step of pattern-etching of the second type semiconductor layer 40, the light-emitting layer 30, and the first type semiconductor layer 20 to reveal a first surface 21 on the first type semiconductor layer 20 by dry etching or wet etching. The average roughness (Ra) of the first surface 21 is larger than 100 nm.

Figure 3D:
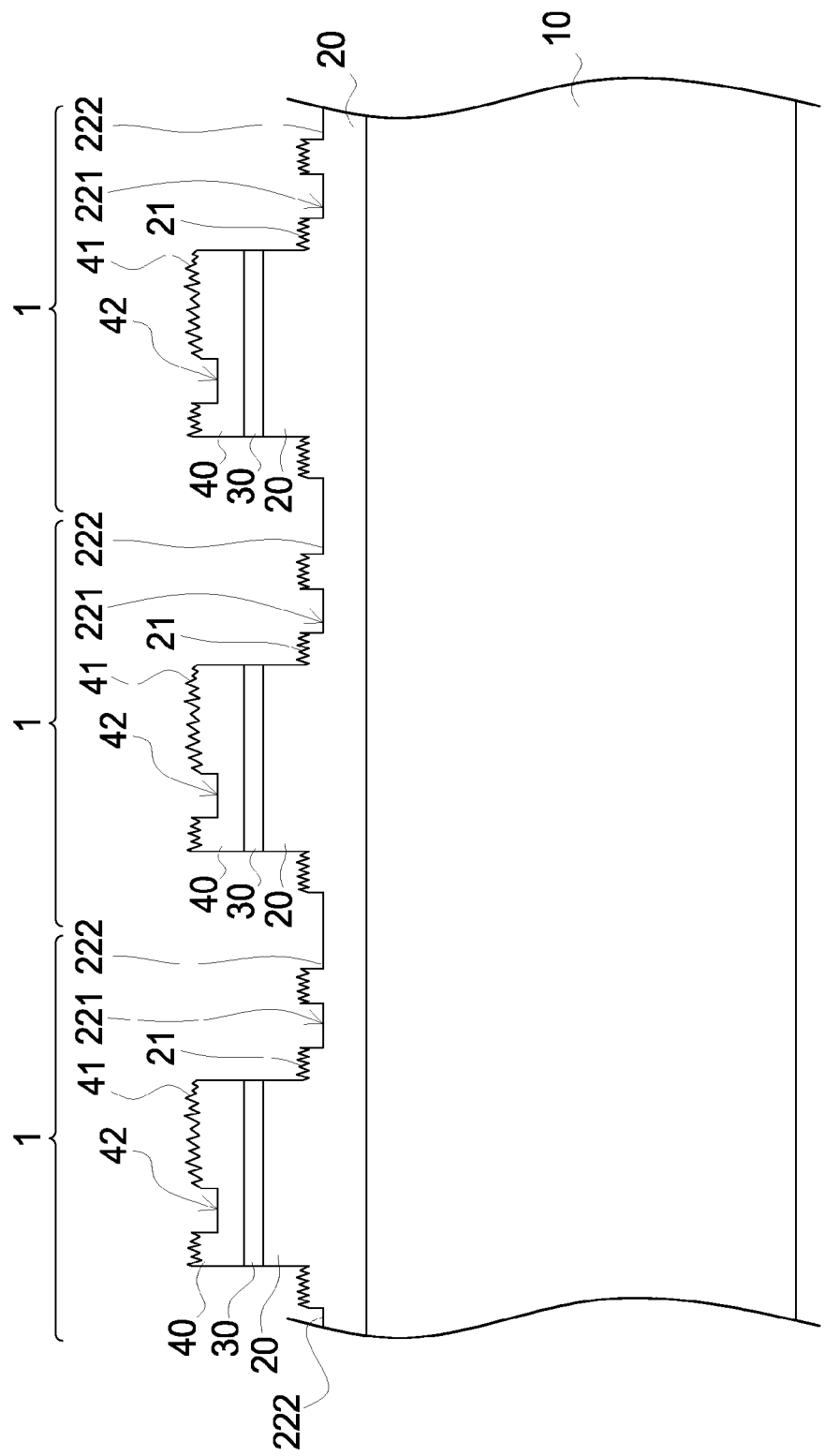

FIG. 3D shows the step of treating the first surface 21 and the fifth surface 41 to form a plurality of fourth surfaces 42, a plurality of second surfaces 222 and a plurality of third surfaces 221 by dry etching or wet etching. The step of treating the first surface 21 and the fifth surface 41 comprises forming a patterned photoresist on the first surface 21 and the fifth surface 41, etching the first surface 21 and the fifth surface 41 where is uncovered by the patterned photoresist, and removing the patterned photoresist. Etching the first surface 21 and the fifth surface 41 comprises dry etching or wet etching. The depth of each of the plurality of second surfaces 222, or the plurality of third surfaces 221, related to the first surface 21 is in a range of 2000 Å and 10000 Å, and preferably is in a range of 4000 Å and 7000 Å. And, the depth of each of the plurality of fourth surfaces 42 related to the fifth surface 41 is also in a range of 2000 Å and 10000 Å, and preferably is in a range of 4000 Å and 7000 Å. The average roughness (Ra) of each of the plurality of the second surfaces 222, the plurality of the third surfaces 221 and the plurality of the fourth surfaces 42 is in a range of 10 nm to 100 nm, and preferably is smaller than 50 nm. The second surface 222 is used for defining a plurality of units 1.

Figure 3E:
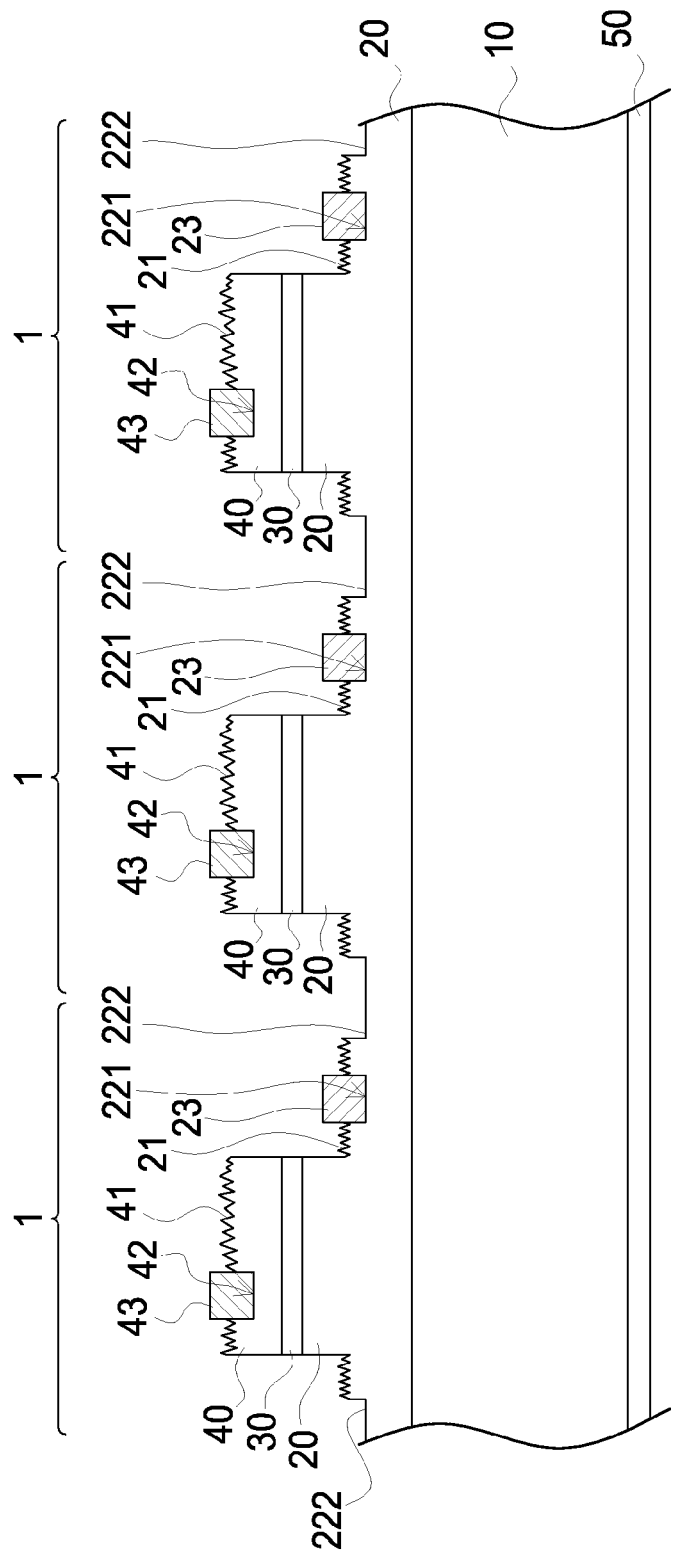

FIG. 3E shows the step of forming a second electrical pad 43 on each of the plurality of fourth surfaces 42 and a first electrical pad 23 on each of the third surfaces 221, and then forming a reflective layer 50 on the bottom surface 102. The reflective layer 50 comprises a metal layer, DBR, or the combination thereof and has a reflectivity larger than 70%. The thickness of the reflective layer 50 is smaller than 5 μm, and preferably is in a range of 2 μm to 3 μm. Before forming the reflective layer 50 on the bottom surface 102, the transparent substrate 10 is thinned to a range of 90 μm to 150 μm by polish, such as CMP. The plurality of first electrical pad 23 and the second electrical pad 43 are operable for conducting an electrical current from outside to flow through the first type semiconductor layer 20, the light-emitting layer 30, and the second type semiconductor layer 40. The material of the first electrical pad 23 and the second electrical pad 43 comprises the metal material, such as Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo or La, or metal alloy, such as Ag—Ti, Cu—Sn, Cu—Zn, Cu—Cd, Sn—Pb—Sb, Sn—Pb—Zn, Ni—Sn, Ni—Co, Au alloy, or Ge—Au—Ni.

Figure 3F:
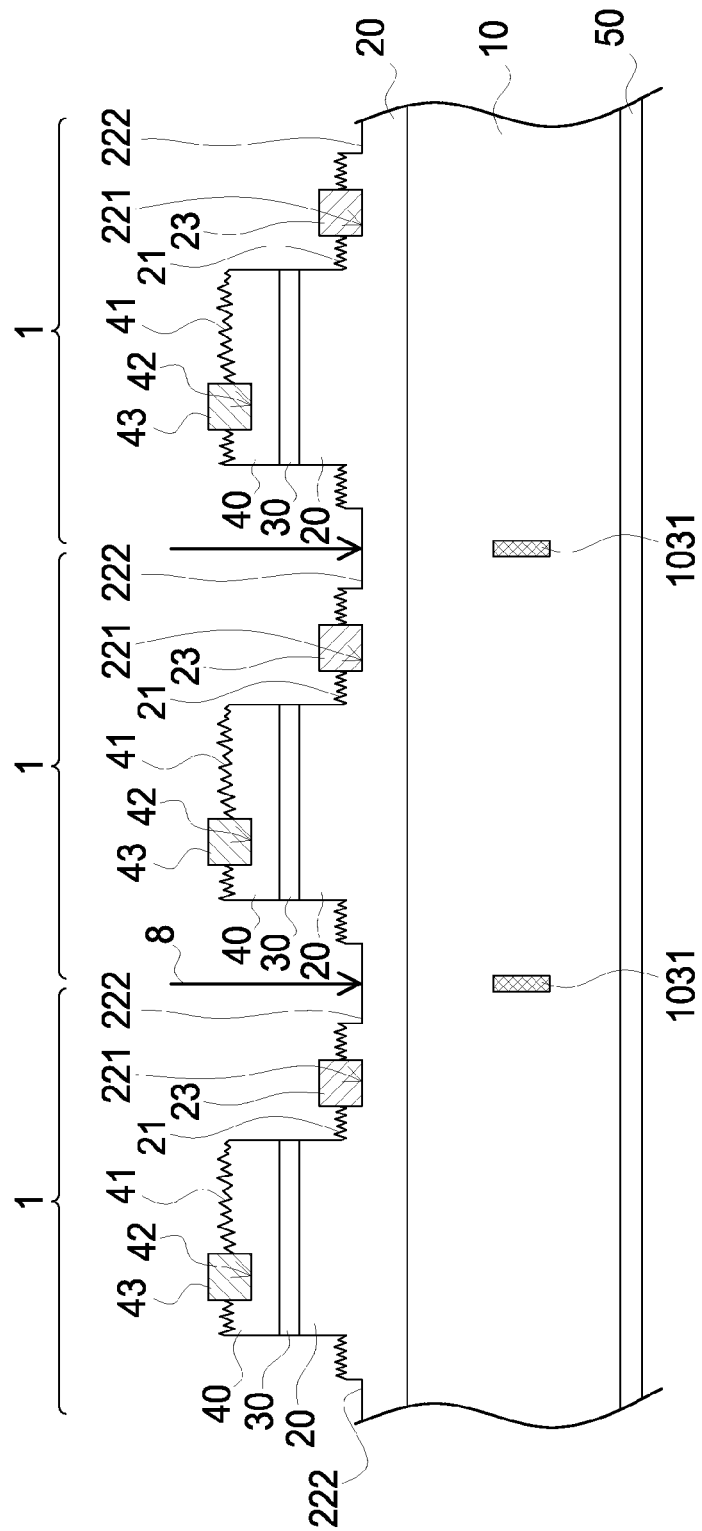

FIG. 3F shows the step of forming a plurality of damage regions 1031 in the transparent substrate 10 under the second surface 222 by providing a laser beam 8. The wavelength range of the laser beam 8 comprises 350-500, 350-800, 350-1200, 500-1000, 700-1200 or 350-1500 nm. Because the average roughness (Ra) of the second surface 222 is in a range of 10 nm to 100 nm, and preferably is smaller than 50 nm, the laser beam 8 can penetrate the second surface 222 and focus in the interior of the transparent substrate 10 to cut the transparent substrate 10 without damaging the first type semiconductor layer 20. For the first surface 21, because the average roughness (Ra) thereof is larger than 100 nm, the laser beam 8 is scattered by the first surface 21 and fail to focus in the interior of the transparent substrate 10 under the upper surface 101.

Figure 3G:
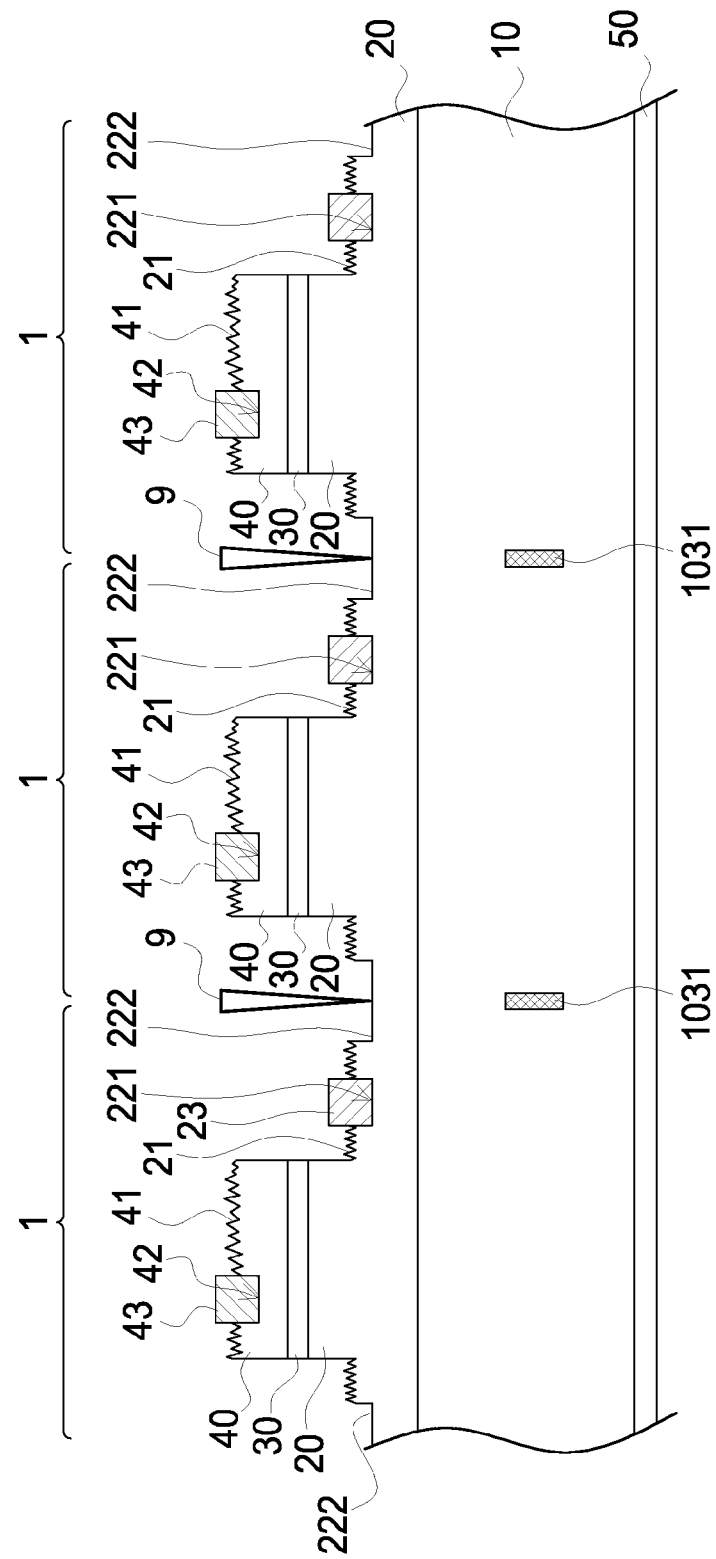

FIG. 3G shows the step of providing a cutter 9 for cleaving the first type semiconductor layer 20, the transparent substrate 10 and the reflective layer 50 along the second surface 222 and through the plurality of damage regions 1031 in the transparent substrate 10 under the second surface 222. The plurality of units 1 can be separated to form a plurality of light-emitting diodes.

Fourth Embodiment

Referring to FIG. 4, a light bulb in accordance with an embodiment of the present application is disclosed. The bulb 600 includes a cover 602, a lens 604, a lighting module 610, a lamp holder 612, a heat sink 614, a connecting part 616, and an electrical connector 618. The lighting module 610 includes a carrier 606 and a plurality of light-emitting elements 608 of any one of the above mentioned embodiments on the carrier 606.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting diode, comprising:
   a substrate, the substrate comprising an upper surface, a bottom surface opposite to the upper surface, and a side surface;
   a first type semiconductor layer on the upper surface, wherein the first type semiconductor layer comprises a first portion and a second portion, and the second portion comprises an edge surrounding the first portion;
   a light-emitting layer on the first portion; and
   a second type semiconductor layer on the light-emitting layer,
   wherein the second portion comprises a first surface and a second surface, and a first distance is between the first surface and the upper surface, and a second distance is between the second surface and the upper surface and is smaller than the first distance,
   wherein the first surface is rougher than the second surface, and the second surface is located at the edge.

2. A light-emitting diode according to claim 1, wherein the substrate comprises a transparent substrate.

3. A light-emitting diode according to claim 1, wherein the second portion further comprises a third surface, wherein a distance between the third surface and the upper surface is equal to the second distance, and the third surface comprises a third average roughness (Ra) in a range of 10 nm to 100 nm.

4. A light-emitting diode according to claim 3, further comprises a first electrical pad on the third surface.

5. A light-emitting diode according to claim 1, wherein the width of the second surface is between 5 μm and 15 μm.

6. A light-emitting diode according to claim 1, wherein the first distance is 2000 Å to 10000 Å larger than the second distance.

7. A light-emitting diode according to claim 1, wherein the first surface comprises a first average roughness (Ra) larger than 100 nm, and/or the second surface comprises a second average roughness (Ra) in a range of 10 nm to 100 nm.

8. A light-emitting diode according to claim 1, further comprising a reflective layer on the bottom surface.

9. A light-emitting diode according to claim 7, wherein the second type semiconductor layer comprises a fifth surface and a fourth surface, and the fifth surface is rougher than the fourth surface.

10. A light-emitting diode according to claim 9, wherein the fourth surface comprises a fourth average roughness (Ra) in a range of 10 nm to 100 nm.

11. A light-emitting diode according to claim 10, wherein the difference between the fourth average roughness (Ra) and the second average roughness (Ra) is smaller than 50 nm.

12. A light-emitting diode according to claim 1, further comprising a damaged region on the side surface and distant from upper surface and bottom surface.

13. A light-emitting diode, comprising:
   a first type semiconductor layer, wherein the first type semiconductor layer comprises a first portion and a second portion, and the second portion comprises a first surface and a second surface;
   a light-emitting layer on the first portion; and
   a second type semiconductor layer on the light-emitting layer, wherein the second type semiconductor layer comprises a fifth surface,
   wherein the first surface and the fifth surface are rougher than the second surface, and the second surface surrounds the first portion.

* * * * *